(12) United States Patent
Widrig et al.

(10) Patent No.: US 10,487,394 B2
(45) Date of Patent: Nov. 26, 2019

(54) METHOD FOR COATING MOTOR PISTONS

(71) Applicant: Oerlikon Surface Solutions AG, Pfaffikon, Pfaffikon SZ (CH)

(72) Inventors: Beno Widrig, Bad Ragaz (CH); Arvid Stellmacher, Sargans (CH); Ruedi Roppel, Balzers (LI); Juergen Ramm, Maienfeld (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 15/553,198

(22) PCT Filed: Feb. 17, 2016

(86) PCT No.: PCT/EP2016/053313
§ 371 (c)(1),
(2) Date: Aug. 24, 2017

(87) PCT Pub. No.: WO2016/135014
PCT Pub. Date: Sep. 1, 2016

(65) Prior Publication Data
US 2018/0237902 A1    Aug. 23, 2018

Related U.S. Application Data

(60) Provisional application No. 62/119,985, filed on Feb. 24, 2015.

(51) Int. Cl.
*C23C 14/04* (2006.01)
*C23C 14/50* (2006.01)
*C23C 14/56* (2006.01)

(52) U.S. Cl.
CPC .......... *C23C 14/505* (2013.01); *C23C 14/046* (2013.01); *C23C 14/564* (2013.01)

(58) Field of Classification Search
CPC .................. C23C 14/046; C23C 14/505
See application file for complete search history.

(56) References Cited

U.S. PATENT DOCUMENTS

2001/0029896 A1    10/2001  Neidhardt
2008/0053841 A1*    3/2008  Baertsch ............... C23C 14/021
                                                            205/640

(Continued)

FOREIGN PATENT DOCUMENTS

DE    102 42 261 A1    3/2004
DE    103 20 979 A1   12/2004

(Continued)

OTHER PUBLICATIONS

International Search Report for PCT/EP2016/053313 dated Apr. 21, 2016.

*Primary Examiner* — Elizabeth A Burkhart
(74) *Attorney, Agent, or Firm* — Pearne & Gordon LLP

(57) ABSTRACT

A method for improving the performance and/or service life of pistons, wherein at least one PVD coating source includes a target. The coating source is arranged on a wall of the coating chamber and is periodically operated. The target surface to be evaporated is positioned parallel to the vertical axis and the surface sections to be coated are positioned in front of the target surface in the coating region using a holding device. The substrate receiving area is rotated periodically about the rotational axis of the substrate receiving area by a rotary system which is a coupling system, or is arranged on the coupling system, or is a part of the coupling system. The rotational axis and the vertical axis form an angle which is larger than 10° and smaller than 180° such that the coating material reaches each part of the individual surface sections at least once.

13 Claims, 4 Drawing Sheets

(56) References Cited

U.S. PATENT DOCUMENTS

| | | | | |
|---|---|---|---|---|
| 2012/0160665 A1* | 6/2012 | Ramm | ............... | C23C 14/325 |
| | | | | 204/192.38 |
| 2013/0071575 A1* | 3/2013 | Muller | ............... | B05B 7/205 |
| | | | | 427/446 |
| 2013/0149450 A1* | 6/2013 | Feuerstein | ............ | B05C 13/02 |
| | | | | 427/282 |
| 2015/0275120 A1* | 10/2015 | Lehnert | ............... | C23C 28/322 |
| | | | | 508/129 |

FOREIGN PATENT DOCUMENTS

| | | |
|---|---|---|
| DE | 10 2012 025 283 A1 | 6/2014 |
| EP | 0 776 594 B1 | 6/1997 |
| EP | 1 881 086 A1 | 1/2008 |
| EP | 2 348 139 A1 | 7/2011 |
| JP | 03-264755 A | 11/1991 |

* cited by examiner

METHOD FOR COATING MOTOR PISTONS

FIELD OF APPLICATION

The present invention relates to a method for increasing the performance and service life of pistons, in particular pistons for internal combustion engines, wherein certain surface parts of a piston, in particular the piston base surfaces, are coated with a layer which is at least partially deposited by means of a PVD method. The present invention also relates to a holding device for coating pistons, in particular piston surfaces, by means of a PVD method.

State of the Art

The coating of certain surfaces of pistons of combustion engines is known from the prior art.

For example, DE10320979A1 describes a method for wear-resistant protection of piston surfaces. Specifically, it is proposed to apply a wear-protection layer with a roughness Ra<1.5 μm produced plasma-electrolytically at least in the region of the first or uppermost annular groove of the piston.

DE102012025283A1 proposes to coat pistons with a heat-insulating coating and describes a method for applying the heat-insulating coating by means of a combination of flame-spraying and sol-gel processes.

Due to the ever-increasing requirements with regard to profitability and increased performance and service life of pistons for internal combustion engines, the use of PVD methods for depositing for example wear-protection and heat-insulating layers on desired surfaces of such pistons could be desirable. However, the use of PVD methods for this purpose has not yet been established.

On the one hand, this is due to the fact that the production of thermally stable and oxidation-resistant PVD layers was not yet ready for production until recently and, on the other hand, this is due to the difficulties that need to be mastered when coating components with complex geometries and/or irregular surfaces by means of PVD processes. Pistons for modern combustion engines nowadays typically have complex geometries and irregular surfaces. Accordingly, the coating of such piston surfaces, such as piston bottom surfaces, is a major challenge.

Object of the Present Invention

The aim of the present invention is to provide a method and a substrate holding device which enables the industrial coating of piston surfaces with complicated shapes by means of PVD processes.

In particular, the method and the holding device according to the present invention are intended to enable complicated piston base shapes to be coated in large numbers in the same batch.

Furthermore, the method and the holding device according to the present invention are intended to enable oxide or oxide-containing layers to be deposited.

DESCRIPTION OF THE PRESENT INVENTION

This aim is achieved by means of the present invention by providing a method according to claim 1 for coating pistons using a holding device as described below.

For a better understanding of the further explanations, reference is made to FIG. 1a to 5.

Figure 1A:
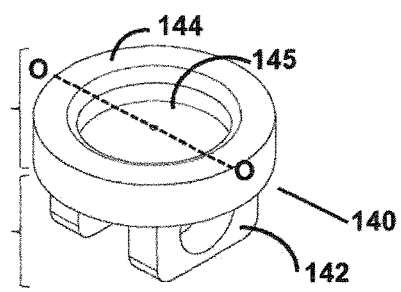
FIGS. 1a and 1b show a steel piston.
Figure 1B:
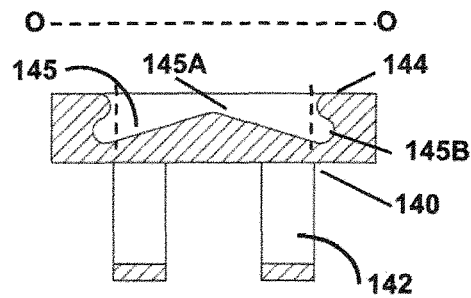

FIGS. 1a and 1b show schematically a steel piston 140 with a guide 142 for the piston pin and a piston surface 144+145 with a complicated surface shape which has a surface with undercuts 145B for the purposes of the present invention. The cross-section O-O of the steel piston in FIG. 1a is schematically illustrated in FIG. 1b.

Figure 2:
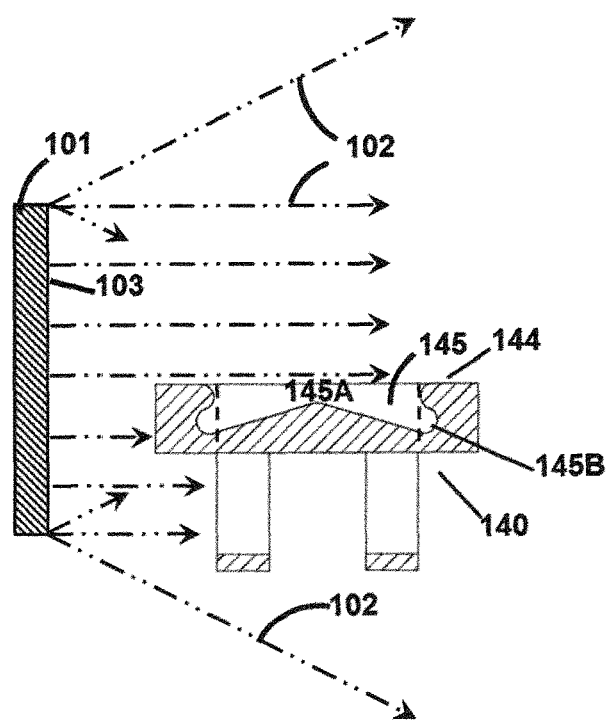
FIG. 2 shows a substrate surface perpendicular to a target.

When coating surfaces by means of PVD processes, one must take into account that the material 102 evaporated by the used PVD coating source with the corresponding target 101 moves mostly in a straight line away from the target surface 103, preferably at angles of about 90° with respect to the surface to be evaporated of the target as shown in FIG. 2. In the context of the present invention, the evaporated material 102 is also referred to as coating material 102. It is to be understood that during the PVD coating process, or when the PVD coating source is in operation, coating material 102 is removed from the target and forms a coating area in the vacuum coating chamber. It must also be understood that if the PVD coating process used is a reactive process, the PVD layer which is grown on the surface to be coated will not only comprise coating material 102 from the target, but in this case the PVD layer deposited on the substrate results from the reaction between a reactive gas present in the coating chamber and the coating material 102 removed from the target. The PVD method may be a sputtering method or a HIPIMS method, preferably an arc evaporation method. It is possible that more than one PVD coating source is used for the deposition of the PVD layer, wherein all PVD coating sources used in a PVD method do not necessarily have to be the same but can comprise different target materials, be operated differently in time and can also be operated with different parameters. In addition, the PVD process for the purposes of the present invention can also be a combined process. For example, it could be a combined PVD+PACVD method.

Because of the abovementioned conditions for the deposition of the coating material 102 from the target by means of PVD methods, the geometrical arrangement of the components or component surfaces to be coated, within the coating chamber during the coating process, is of decisive importance as to whether and which parts of the substrate surface are to be coated.

FIG. 2 shows, for example, an arrangement configuration in which the substrate surface 145 to be coated is essentially achieved only by coating material 102, which basically moves away from the target surface 103 mainly at an angle of less than 90° with respect to the surface to be evaporated of the target, and also from target regions above the substrate surface. In this case, too little coating material 102 will reach the surface 145 to be coated. Accordingly, in such an arrangement configuration, on the one hand the layer rate on the surface 144+145 to be coated will be too low, and on the other hand the surfaces of recesses 145A and undercuts 145B will remain virtually uncoated or incompletely coated because these surfaces remain practically shadowed due to the geometrical arrangement.

Figure 3:
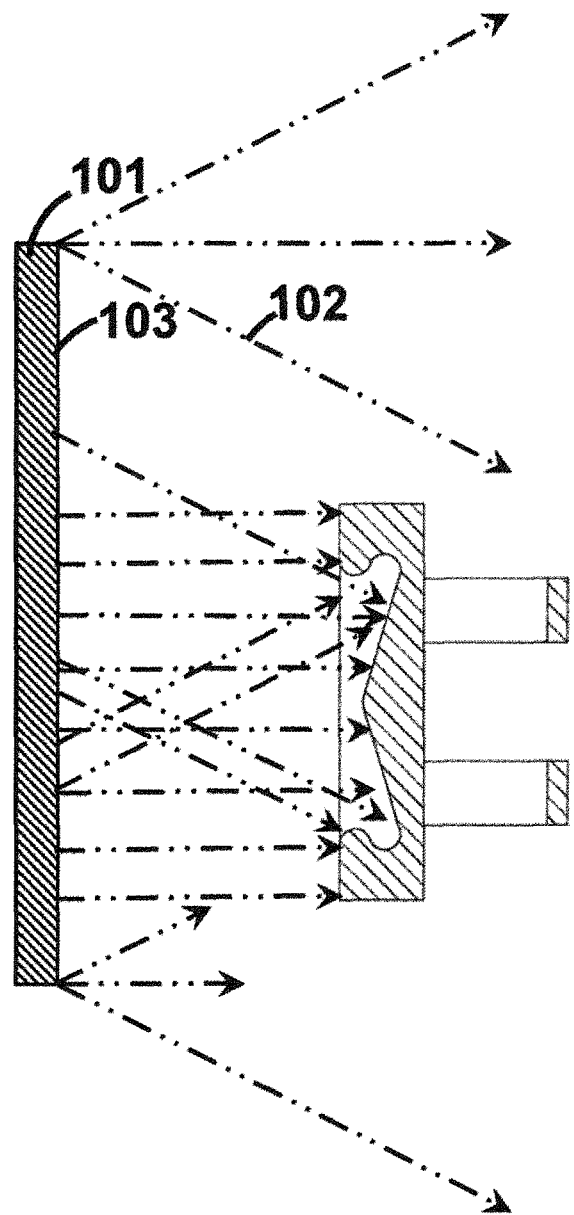
FIG. 3 shows a substrate surface parallel to a target.

FIG. 3 shows, by way of example, a further arrangement configuration in which the substrate surface 144+145 to be coated is arranged essentially parallel to the target surface 103, so that more coating material 102 arrives from the target onto the substrate surface 144+145 to be coated and in this way more coating material 102 is applied to these surfaces. However, the inventors have found that when using this arrangement configuration, the surface area 145A to be coated can be well coated, but the surface area 145B to be coated is not or only partially coated. Accordingly, the desired protection of the piston by coating with this arrangement configuration can also not be ensured satisfactorily.

Figure 4A:
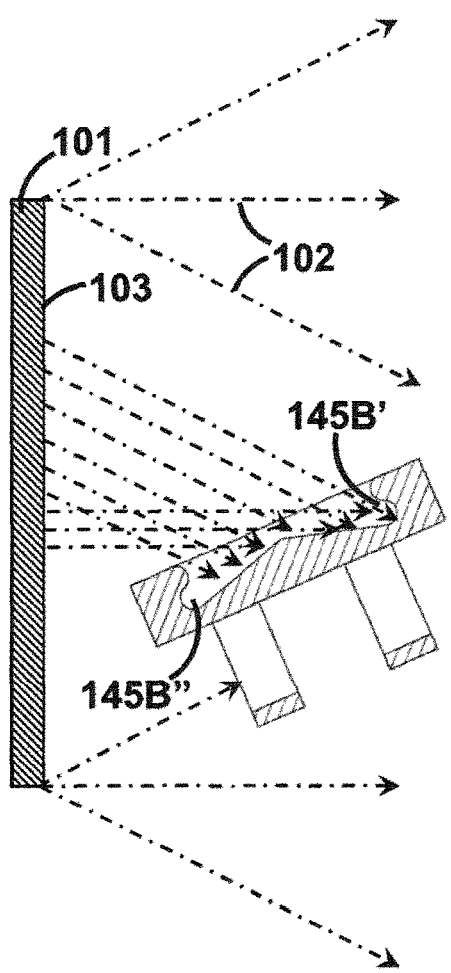
FIGS. 4a and 4b show a substrate surface at an oblique angle to a target.
Figure 4B:
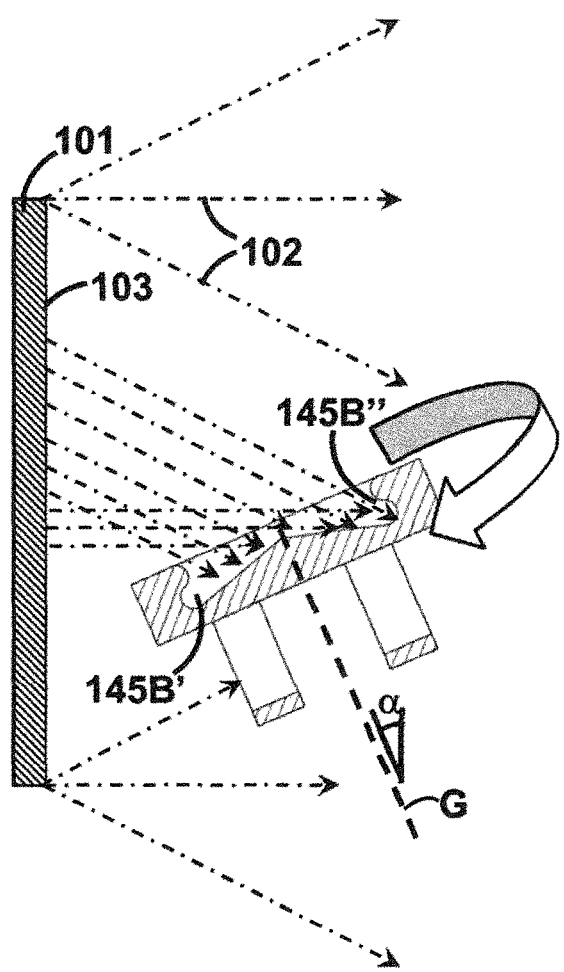

In order to satisfactorily coat the two surface areas 145A and 145B mentioned above, the inventors have tried out a third arrangement configuration which is schematically illustrated in FIGS. 4a and 4b. In this arrangement configuration, the substrate surface 145 to be coated was first positioned obliquely in front of the target by an angle α relative to the vertical axis, as shown in FIGS. 4a and 4b, respectively. In this connection, the inventors have found that there has been a satisfactory coating of the surface area 145A as well as of a part 145B' of the surface area 145B. Only when the inventors moved the substrates to be coated around their own axis of rotation during the coating as schematically illustrated in FIG. 4b did the coating of the additional parts 145B" of the surface area 145B occur. Thus all desired surface areas, namely 144, 145A and 145B cold be satisfactorily coated.

This effort in substrate movement is justified by the advantages of applying a PVD layer to other coating processes.

PVD technology includes both non-reactive and reactive physical deposition processes from the gas phase. It is particularly important that layers that are stable at high temperatures can be deposited at comparatively low substrate temperatures by means of the PVD technology. This applies both to nitrides such as for example CrN and TiN or TiAlN, but in an even more pronounced manner to oxidic layers such as for example chromium oxide in the stable Eskolaite structure or aluminum oxide in the corundum structure or aluminum chromium oxide as a mixed crystal in corundum structure or multilayer structures consisting of Cr—N and Cr—O or Cr—ON. Such oxide layers or oxide-containing layers exhibit high resistance to oxidation, in some cases to well above 1000° C., but can be synthesized at substrate temperatures well below 500° C. by means of PVD methods. This allows the use of such layers even on comparatively inexpensive substrate materials. On the other hand, expensive substrate materials specially selected for an application at higher temperatures can be replaced by low-cost materials with a PVD layer.

A further advantage of a PVD coating is that a large number of substrates can be coated simultaneously in a PVD coating process. This reduces the coating costs per substrate and at the same time allows a better utilization of the target material.

However, what is important is especially the fact that a PVD coating in which the substrates are arranged and moved as described above makes it possible to coat complicated surface geometries, even surfaces with cavities and undercuts. This has a clear advantage over a manufacturing process that must be adapted to a new substrate geometry either because each substrate is treated individually as in the case of thermal spraying or because the method is only adapted specifically for each substrate geometry as in the case of application welding.

Small changes in the substrate geometry require among others no new process adjustments, i.e. PVD technology is characterized by a high flexibility in this respect.

Figure 5:
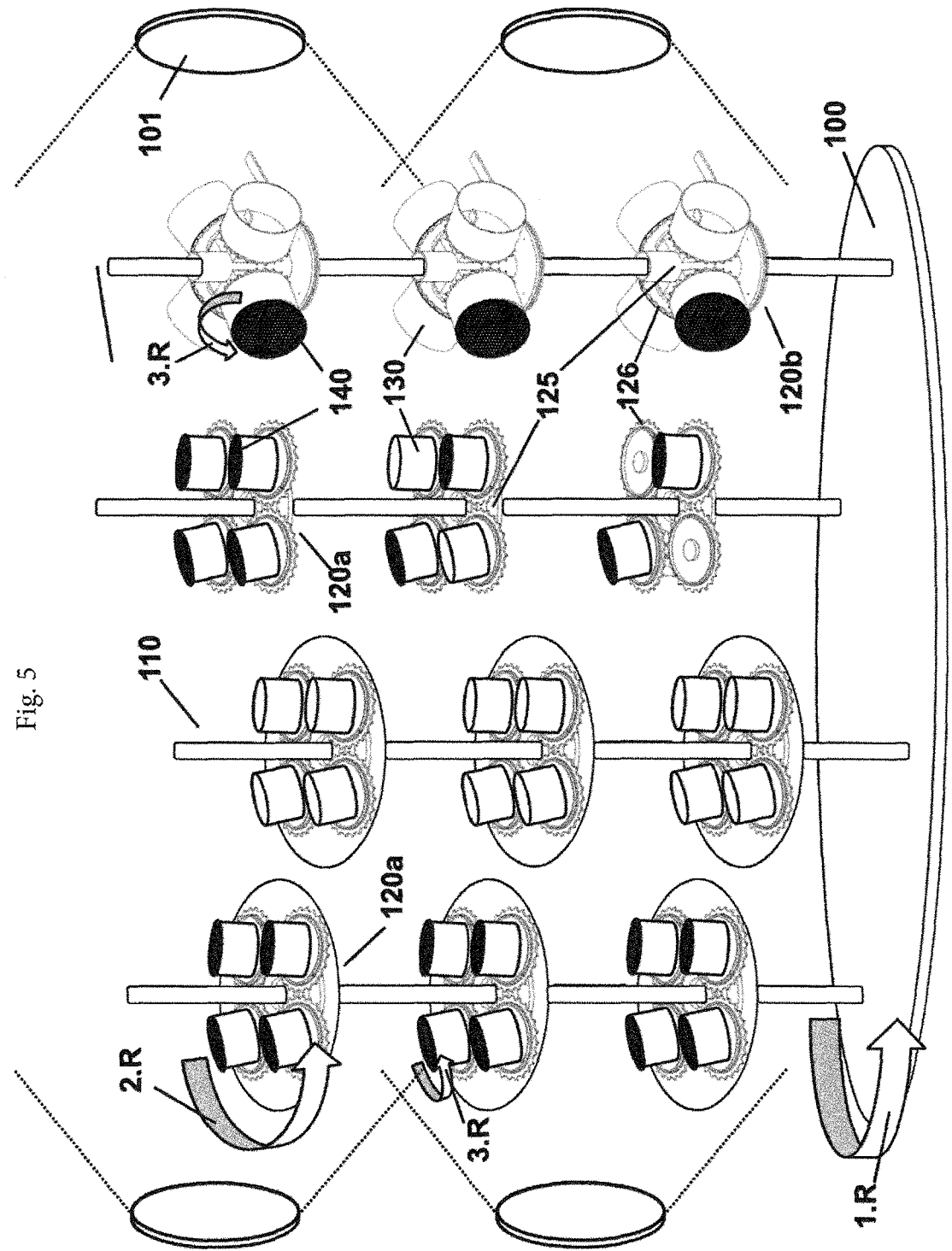
FIG. 5 shows a substrate holding device.

FIG. 5 shows a schematic representation of a preferred embodiment of a PVD coating chamber with an arrangement configuration and a substrate holding device according to the present invention. Coating sources or plasma sources 101 are placed on the inner walls of the coating chamber (not shown) and from which coating material 102 is provided that is to be applied directly to the surfaces of the substrates 140 to be coated or that is to at least partially react with reactive gas and to be applied to the coated surfaces of the substrates 140.

The components 140 to be coated are held according to the invention in rotatably arranged rotary plates 120a and/or 120b, which are likewise located in trees 110 on a carousel 100 preferably arranged in the central region of the coating chamber. In this connection, a first rotational movement 1.R is performed and a second rotational movement 2.R of the substrates 140 to be coated are respectively achieved by the rotatable carousel 100 and by the rotatable rotary plates 120a and/or 120b.

According to a preferred embodiment of a substrate holding device according to the invention, the rotary plate 120a, 120b comprises a main body 125, at least a substrate receptacle 130 and a coupling system 126 for connecting at least one substrate receptacle 130 to the base body 125, wherein the coupling system 126 is designed as a rotation system, in order to displace the substrate receptacle 130 in its own rotational axis G in a third rotational movement 3.R.

Specifically, the present invention discloses a method for increasing the power and/or service life of pistons, especially pistons for internal combustion engines, wherein the method comprises the steps of:
a. securing at least one piston 140 with surface parts to be coated 144, 145A, 145B in a substrate receptacle 130 which is arranged on a substrate holding device by means of a coupling system 126,
b. placing the substrate holding device with the piston to be coated into a coating area of the coating chamber,
c. coating the surface parts to be coated 144, 145A, 145B, characterized in that,
d. during coating, at least one PVD coating source arranged on a wall of the coating chamber with target 101 is operated at least periodically, the target surface 103 to be evaporated is arranged at least for the most part parallel to the vertical axis, and the surface parts to be coated 144, 145A, 145B are held with the aid of the holding device at least from time to time in a position in front of the target surface in the coating area 103, whereby
e. by means of a rotation system which is arranged at the coupling system 126 or is part of the coupling system, the substrate receptacle 130 is made to rotate at least periodically in its own axis of rotation G, and the axis of rotation G has an angle α greater than 10° and less than 180° with respect to the vertical axis, so that each part of the individual surface parts 144, 145A, 145B is reached at least once by coating material 102.

This rotational movement ensures that coating materials 102, which are removed from the target and evaporate rectilinearly at an angle of approximately 90° relative to the target surface, at least once reach each individual part 144, 145A, 145B', 145B" of the surface parts to be coated 144, 145A, 145B of the piston, thereby completely and satisfactorily coating the selected surfaces 144 and 145 of the piston.

According to a further preferred variant of the present invention, the substrate receptacle 130 is designed in such a way that the surfaces of the piston 140 which are not to be coated are covered by the substrate receptacle 130 itself.

In a further preferred variant for the angles α>45°, the substrates are secured to the substrate receptacle via a securing device such that they are prevented from falling out, which is particularly relevant for coatings in which the substrates to be coated align with the substrate surface downwards, i.e. for angles α>90°.

More specifically, the present invention discloses a method for increasing the power and/or service life of pistons, wherein the method comprises the steps of:
 a. securing at least one piston 140 with surface parts to be coated 144, 145A, 145B in a substrate receptacle 130 which is arranged on a substrate holding device by means of a coupling system 126,
 b. placing the substrate holding device with the piston to be coated into a coating area of the coating chamber,
 c. coating the surface parts to be coated 144, 145A, 145B, wherein
 d. at least one PVD coating source arranged on a wall of the coating chamber is coated at least periodically with a target 101, the target surface 103 to be evaporated is arranged at least for the most part parallel to the vertical axis, and the surface parts to be coated 144, 145A, 145B are held with the aid of the holding device at least from time to time in a position in front of the target surface in the coating area 103, and
 e. by means of a rotation system which is simultaneously designed as a coupling system 126 or is arranged on the coupling system or is executed as a part of the coupling system 126, the substrate receptacle 130 is made to rotate at least periodically in its own axis of rotation G, and the axis of rotation G has an angle α greater than 10° and less than 180° with respect to the vertical axis, so that each part of the individual surface parts 144, 145A, 145B is reached at least once by coating material 102.

A method as described above, wherein the piston 140 is a piston for internal combustion engines having undercuts 145B to be coated.

A method as described above, wherein the substrate receptacle 130 is designed to mask the surfaces of the piston 140 which are not to be coated and thereby prevent their coating.

A method as described above, wherein the substrate receptacle is cup-shaped.

A method as described above, wherein the substrate holding device comprises a plurality of receptacles 130 with pistons 140 to be coated, wherein each individual piston is rotated around three axes, and wherein the third rotational axis is the respective own axis of rotation G of each substrate receptacle 130.

The method as described above, wherein the holding device also comprises:
 a carousel 100 rotatable in its own vertical axis,
 at least one, preferably a plurality of trees 110 arranged on the carousel 100 radially and rotatably in their own vertical axis with main bodies 125 arranged height-wise, and on which at least one, preferably a plurality of, substrate receptacles 130 are arranged,
 and wherein the rotation of the carousel corresponds to the first rotation 1.R, the rotation of the trees with the main bodies 125 corresponds to the second rotation 2.R, and the rotation of each substrate receptacle 130 in their own rotational axis G corresponds to the third rotation 3.R.

A method as described above, wherein the angle a is selected to be greater than 90° for the purpose of avoiding layer defects by particle deposition during or after coating.

A method as described above, wherein the third rotation 3.R is respectively carried out via a toothed ring which is part of the coupling system 126.

A method as described above, wherein the substrate receptacle 130 is connected to the main body 125 by a bayonet support.

A method as described above, wherein the piston 140 in the substrate receptacle 130 is prevented from falling out by a securing device.

A method as described above, wherein at least one bracket or one bayonet holder is used as the securing device.

The invention claimed is:

1. Method for increasing the power and/or service life of pistons, wherein the method comprises the steps of:
 a. securing at least one piston (140) having an undercut formed in an upper surface of the at least one piston (140) to be coated (145B) in a substrate receptacle (130) which is arranged on a substrate holding device by means of a coupling system (126),
 b. placing the substrate holding device with the piston to be coated into a coating area of the coating chamber,
 c. coating the undercut to be coated (145B), wherein,
 d. during coating, at least one PVD coating source arranged on a wall of the coating chamber with target (101) is operated at least periodically, a target surface (103) of the target (101) to be evaporated is arranged at least for the most part parallel to the vertical axis, and the undercut to be coated (145B) is held with the aid of the holding device at least from time to time to align with coating material (102) exiting the target surface (103) in a direction perpendicular to the target surface (103) in the coating area (103), wherein
 e. by means of a rotation system which is simultaneously designed as a coupling system (126) or is executed as a part of the coupling system (126), the substrate receptacle (130) is made to rotate at least periodically in its own axis of rotation (G), and the axis of rotation (G) has an angle a greater than 10° and less than 180° with respect to the vertical axis, so that the undercut (145B) is reached at least once by the coating material (102).

2. Method according to claim 1, characterized in that the piston (140) is a piston for internal combustion engines.

3. Method according to claim 1, characterized in that the substrate receptacle (130) is designed such that it masks the surfaces of the piston (140) which are not to be coated and thereby prevents their coating.

4. Method according to claim 1, characterized in that the substrate receptacle is designed in the shape of a cup.

5. Method according to claim 1, characterized in that the substrate holding device comprises a plurality of receptacles (130) with pistons (140) to be coated, wherein each individual piston being rotated around three axes, and the third rotational axis each having its own axis of rotation (G) of each substrate receptacle (130).

6. Method according to claim 5, characterized in that the holding device also comprises the following elements:
 a carousel (100) rotatable in its own vertical axis,
 at least one tree arranged on the carousel (100) radially and rotatably in a vertical axis with main bodies (125) arranged height-wise, and on which at least one substrate receptacle (130) is arranged,
 and wherein the rotation of the carrousel corresponds to the first rotation (1.R), the rotation of the trees with the main bodies (125) corresponds to the second rotation (2.R), and the rotation of each substrate receptacle (130) in their own rotational axis (G) corresponds to the third rotation (3.R).

7. Method according to claim 6, characterized in that the substrate receptacle (130) is connected to the main body (125) by a bayonet support.

8. Method according to claim 6, comprising a plurality of trees (110) arranged on the carousel (100) radially and rotatably in their own vertical axis with main bodies (125) arranged height-wise.

9. Method according to claim 6, comprising a plurality of substrate receptacles (130).

10. Method according to claim 5, characterized in that the third rotation (3.R) is respectively carried out via a toothed ring, which is part of the coupling system (126).

11. Method according to claim 1, characterized in that the angle a is selected to be greater than 90° for the purpose of avoiding layer defects by particle deposition during or after coating.

12. Method according to claim 1, characterized in that the piston (140) in the substrate receptacle (130) is prevented from falling out by a securing device.

13. Method according to claim 12, characterized in that at least one bracket or a bayonet holder or a magnet is used as a securing device.

\* \* \* \* \*